(12) United States Patent
Dwelley et al.

(10) Patent No.: US 9,667,429 B2
(45) Date of Patent: May 30, 2017

(54) PSE CONTROLLER IN POE SYSTEM DETECTS DIFFERENT PDS ON DATA PAIRS AND SPARE PAIRS

(71) Applicant: Linear Technology Corporation, Milpitas, CA (US)

(72) Inventors: David Dwelley, Santa Barbara, CA (US); Jeffrey Heath, Santa Barbara, CA (US); Heath Stewart, Santa Barbara, CA (US); Michael Paul, Santa Barbara, CA (US)

(73) Assignee: Linear Technology Corporation, Milpitas, CA (US)

( * ) Notice: Subject to any disclaimer, the term of this patent is extended or adjusted under 35 U.S.C. 154(b) by 163 days.

(21) Appl. No.: 14/705,849

(22) Filed: May 6, 2015

(65) Prior Publication Data

US 2015/0326403 A1    Nov. 12, 2015

Related U.S. Application Data

(60) Provisional application No. 61/989,316, filed on May 6, 2014.

(51) Int. Cl.
*H04L 12/931* (2013.01)
*H04L 12/10* (2006.01)
*G01R 31/04* (2006.01)
*G06F 1/26* (2006.01)

(52) U.S. Cl.
CPC ............ *H04L 12/10* (2013.01); *G01R 31/041* (2013.01); *G06F 1/266* (2013.01); *G06F 1/26* (2013.01); *H04L 49/351* (2013.01)

(58) Field of Classification Search
CPC ..... H04L 12/10; H04L 49/351; G01R 31/041; G06F 1/266; G06F 1/26
See application file for complete search history.

(56) References Cited

U.S. PATENT DOCUMENTS

| | | | |
|---|---|---|---|
| 7,154,381 B2 * | 12/2006 | Lang | H04L 12/10 340/12.32 |
| 8,037,323 B2 | 10/2011 | Diab et al. | |
| 8,305,906 B2 | 11/2012 | Karam | |
| 8,886,973 B2 * | 11/2014 | Karam | G06F 1/26 713/300 |
| 9,069,539 B2 * | 6/2015 | Schlichter | G06F 1/266 |
| 2006/0215680 A1 * | 9/2006 | Camagna | H04L 12/12 370/419 |

(Continued)

*Primary Examiner* — Jaweed A Abbaszadeh
*Assistant Examiner* — Brian J Corcoran
(74) *Attorney, Agent, or Firm* — Patent Law Group LLP; Brian D. Ogonowsky

(57) ABSTRACT

A PSE includes a PSE controller that performs a handshaking routine with any PDs connected to the data wire pairs and spare wire pairs and applies power to the data wire pairs and spare wire pairs, via a switch, if certain conditions are met. Two different levels of currents are supplied to different terminals of the PSE controller that are connected to the data wire pairs and the spare wire pairs, and the resulting voltages are measured. The voltages are used to determine the PD impedances at the ends of the data wire pairs and spare wire pairs to determine whether a PD is connected to the data wire pair, whether another PD is connected to the spare wire pair, or whether a single PD is connected to both the data wire pairs and the spare wire pairs.

10 Claims, 7 Drawing Sheets

(56) References Cited

U.S. PATENT DOCUMENTS

| | | | |
|---|---|---|---|
| 2007/0296391 A1* | 12/2007 | Bertin | G01R 35/005 323/303 |
| 2008/0164890 A1* | 7/2008 | Admon | H04L 12/10 324/713 |
| 2010/0045302 A1* | 2/2010 | Karam | H04L 12/10 324/539 |
| 2016/0197734 A1* | 7/2016 | Darshan | H04L 12/10 307/1 |
| 2016/0197735 A1* | 7/2016 | Ferentz | G05F 3/16 307/1 |

* cited by examiner

| CONDUCTOR | ALTERNATIVE A (MDI-X) | ALTERNATIVE A (MDI) | ALTERNATIVE B (ALL) |
|---|---|---|---|
| 1 | NEGATIVE $V_{PSE}$ | POSITIVE $V_{PSE}$ | |
| 2 | NEGATIVE $V_{PSE}$ | POSITIVE $V_{PSE}$ | |
| 3 | POSITIVE $V_{PSE}$ | NEGATIVE $V_{PSE}$ | |
| 4 | | | POSITIVE $V_{PSE}$ |
| 5 | | | POSITIVE $V_{PSE}$ |
| 6 | POSITIVE $V_{PSE}$ | NEGATIVE $V_{PSE}$ | |
| 7 | | | NEGATIVE $V_{PSE}$ |
| 8 | | | NEGATIVE $V_{PSE}$ |

FIG. 1
(PRIOR ART)

PSE CONTROLLER IN POE SYSTEM DETECTS DIFFERENT PDS ON DATA PAIRS AND SPARE PAIRS

CROSS-REFERENCE TO RELATED APPLICATIONS

This application claims priority to U.S. provisional application Ser. No. 61/989,316, filed May 6, 2014, by David Dwelley et al.

FIELD OF THE INVENTION

This invention relates to Power over Ethernet (PoE) systems, where DC power is generated by Power Sourcing Equipment (PSE) and transmitted over differential data lines to a Powered Device (PD). The invention more particularly relates to a PSE that can detect a variety of possible types of PDs, if any, connected to the data wire pairs and spare wire pairs of the Ethernet cable and appropriately configure its output.

BACKGROUND

In PoE, limited power is transmitted to Ethernet-connected equipment (e.g., VoIP telephones, WLAN transmitters, security cameras, etc.) from an Ethernet switch. In a PoE system, DC power from the switch is transmitted over one or more twisted wire pairs. The same twisted wire pair may also transmit/receive differential data signals. In this way, the need for providing any external power source for the PDs can be eliminated. The standards for PoE and PoDL are set out in IEEE 802.3 and are well-known. The PSE's typically include one or more ICs that are specifically designed for a particular PoE configuration and cabling. There are a variety of cabling permutations, such as straight-thru, crossover, and Y-cables.

PSEs are sometimes given the option of which twisted wire pairs to power: the data pair and/or the spare pair. Certain high power PoE systems exceed the present IEEE limit of 25.5 W and must send power to the PD(s) over all four pairs simultaneously to share the power load.

What is needed is a single PSE design capable of detecting all types of PoE topologies using a single PSE architecture such that the PSE can support a variety of current and future PoE cabling and power permutations.

SUMMARY

A PSE includes a PSE controller IC that performs a handshaking routine with any PDs connected to the data wire pairs and spare wire pairs and applies power to the data wire pairs and spare wire pairs if certain conditions are met. The PSE controller IC controls a switch (e.g., a MOSFET) to supply the full PoE voltage to the data wire pairs and the spare wire pairs if the conditions are met.

An OUT1 pin of the PSE controller IC supplies test currents to the data wire pairs to determine if a PoE-compatible PD is connected to the data wire pairs. An OUT2 pin of the PSE controller IC supplies test currents to the spare wire pairs to determine if a PoE-compatible PD is connected to the spare wire pairs. The data wire pairs and spare wire pairs are connected to the switch (supplying the full PoE voltage) via low value resistors.

The resistors and switch are also connected to a SENSE pin of the PSE controller IC.

By supplying the test currents and detecting the voltages at the various pins, it is determined by the PSE controller IC whether a single PD is connected to all the four wire pairs, or whether a single PD is connected to the data wire pairs, or whether a single PD is connected to the spare wire pair. The PSE controller then closes the switch to supply power to all the wire pairs if certain conditions are met.

BRIEF DESCRIPTION OF THE DRAWINGS

FIG. 1 is a table identifying allowable voltages that may be applied to the 8 wires in a standard CAT-5 Ethernet cable, in accordance with the IEEE standards.

DETAILED DESCRIPTION

A PSE technique is described that can detect a variety of types of PoE configurations and then supply the correct power to the wire pairs. In this way, a single PSE product can support a variety of current and future PoE cabling and power permutations.

In the various figures, only the power channels of the PoE system are shown. The data channels, supplying differential data to the wire pairs from any source, may be conventional and are not shown.

It is important to define the terms cable, pair-set, and pair. A standard Ethernet cable is composed of 8 individual conductors. These are grouped into four twisted pairs. The IEEE PoE standard groups two sets of twisted pairs into Alternative A (Data Pairs) or Alternative B (Spare Pairs). These groups of 4 conductors will be referred to as pair-sets. FIG. 1 is a chart from the IEEE standards illustrating the allowable voltages that can be applied to the various wires by the PSE.

Figure 2:
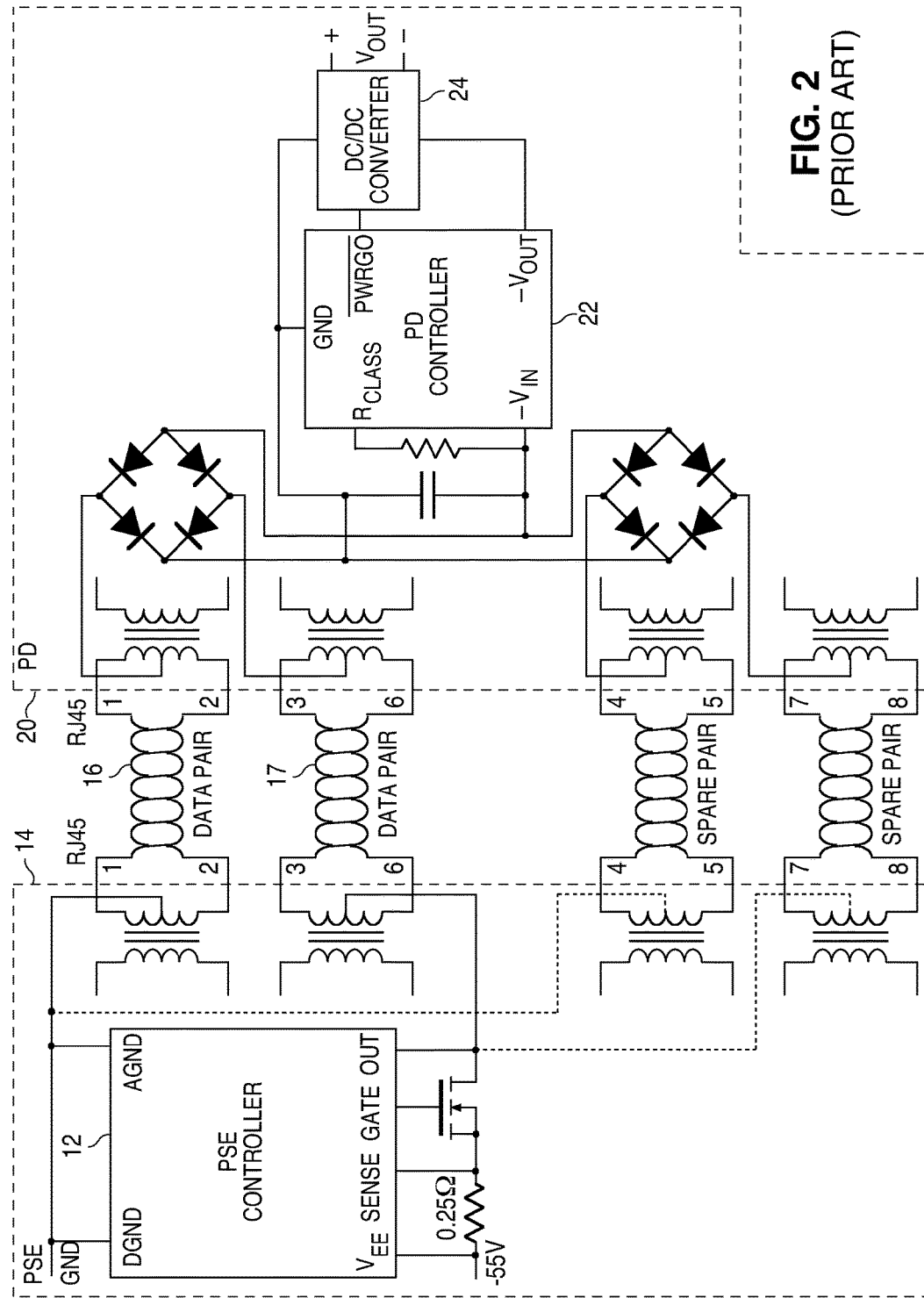
FIG. 2 illustrates a prior art PoE system where power is supplied by a single PSE controller IC to a single PD converter via the data wire pairs.

A traditional IEEE two-pair PSE-PD system is shown in FIG. 2. A PSE controller IC 12, in the PSE 14, performs low voltage/current tests via the data wire pairs 16, 17 to detect whether the PD 20 is PoE-compatible and to detect the power requirements of the PD 20. This is referred to as detection and classification. The PD controller IC 22 operates with the PSE controller IC 12 to perform the handshaking routines. If the PD 20 is PoE-compatible, the PSE 12 provides ground and −55V to the wire pairs 16 and 17, respectively. These voltages are polarity corrected by the diode bridges in the PD 20. A DC/DC converter 24 then converts the received voltage to the target voltage Vout needed by the PD load.

The PSE controller IC 12 will detect, classify, and provide power via either the data pairs or the spare pairs but not both. The PD 20 must be designed to accept power on either set of pairs.

Figure 3:
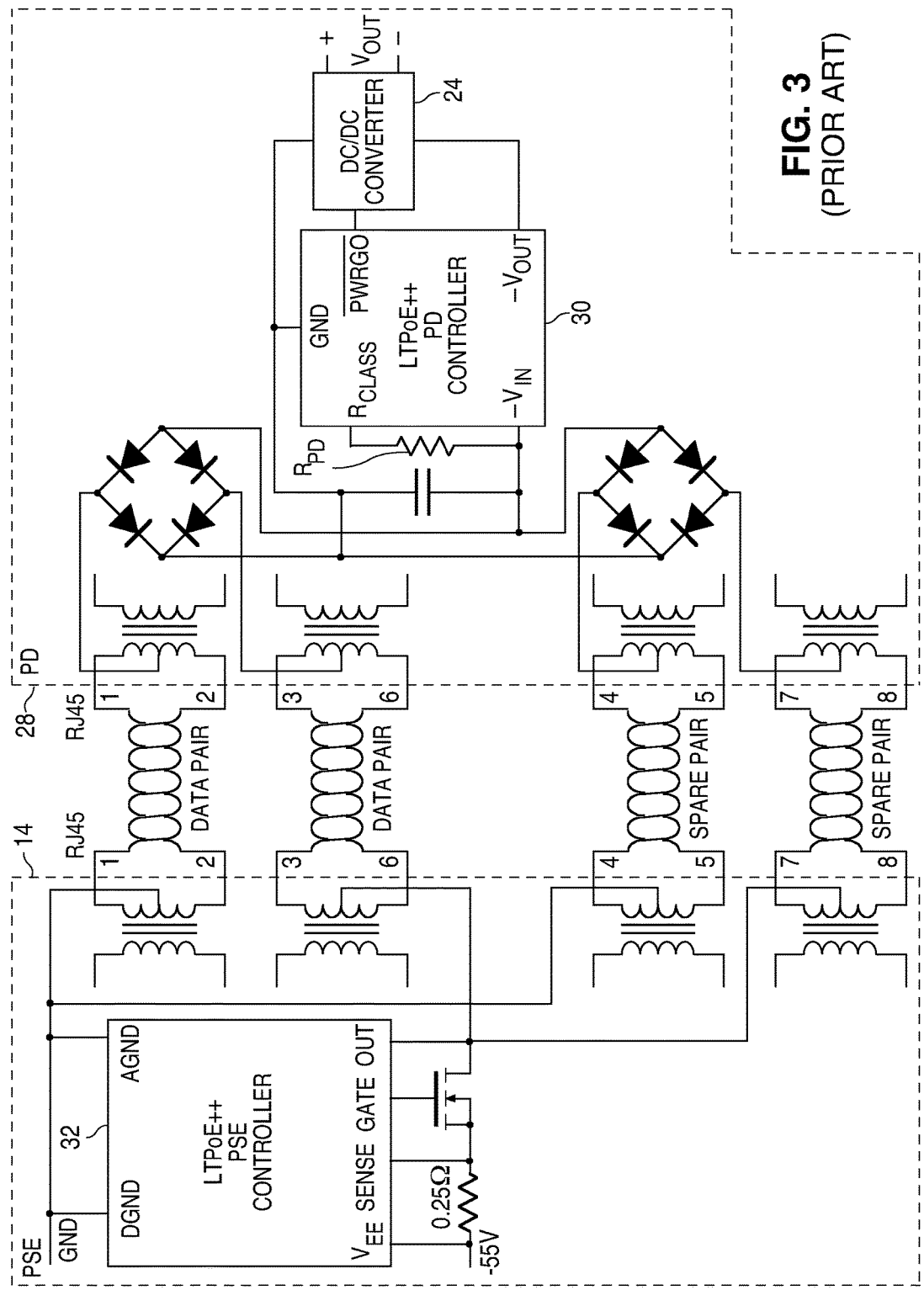
FIG. 3 illustrates a prior art PoE system where power is supplied by a single PSE controller IC to a single PD converter via the data wire pairs and the spare wire pairs.

FIG. 3 illustrates a modern four pair PSE-PD system, such as an LTPoE++ system by Linear Technology Corporation. A single PD 28 presents its detection signature (25 kOhm resistor $R_{PD}$) on all four pairs using the LTPoE++PD controller IC 30. The single LTPoE++PSE controller IC 32 detects the PD controller signals on all four pairs and supplies power to the four pairs. In this way, relatively high power may be shared by the four sets of twisted pairs.

Figure 4:
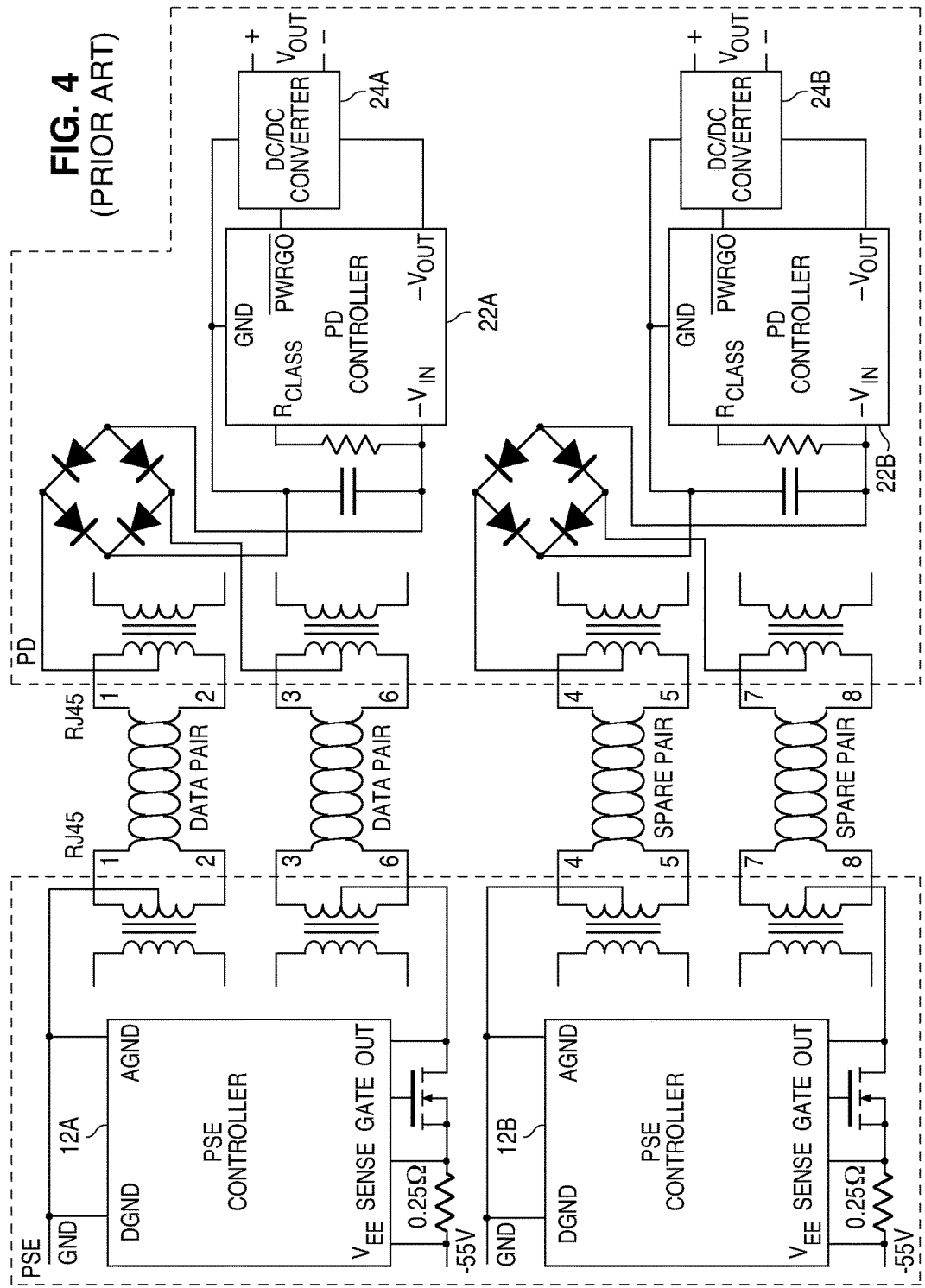
FIG. 4 illustrates a prior art PoE system where power is independently supplied by dual PSE controller ICs to associated PD converters via the data wire pairs and the spare wire pairs.

FIG. 4 illustrates another known topology for transmitting power over the four pairs. In FIG. 4, two PSE controller ICs 12A and 12B independently operate with two PD controller ICs 22A and 22B to determine, in the detection and classification phases, whether to supply power over their associated data wire pairs and spare wire pairs. The DC/DC converters 24A and 24B then supply the target voltage in parallel to the PD load. Such a solution is cost prohibitive due to the multiplicity of PSE and PD controllers.

Figure 5:
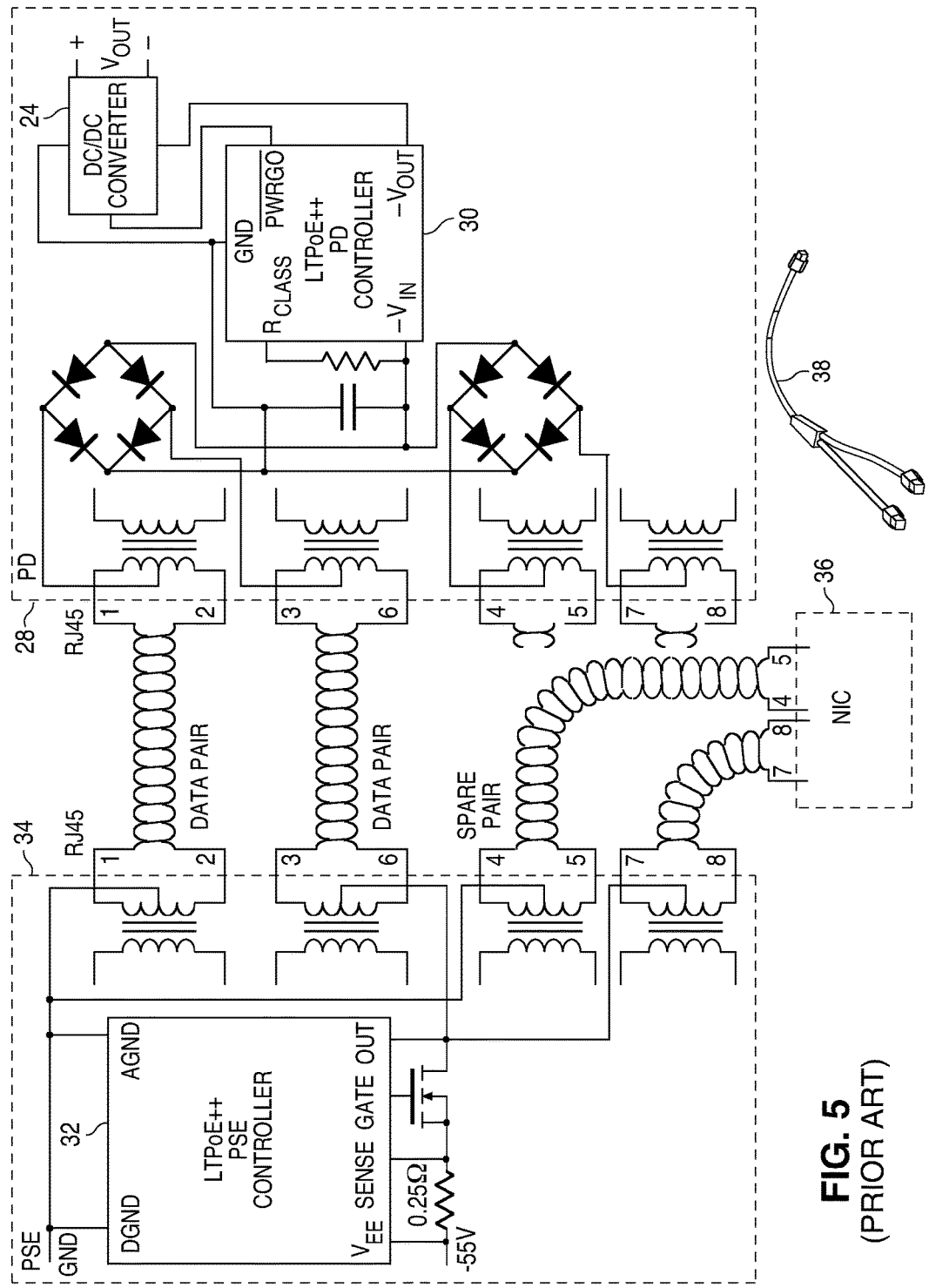
FIG. 5 illustrates a prior art PoE system where power is supplied by a single PSE controller IC to a single PD converter via the data wire pairs and to another device via the spare wire pairs.

In addition, as shown in FIG. 5, Y-cables exist which are physically split into two connectors. The PSE side of the cable is composed of a single RJ45 jack containing all four pairs, as normal. The other end of the cable is split into two pair-sets. Each pair set is terminated with a separate RJ45 jack. Thus a single PSE 34 can simultaneously supply power to the PD 28 via the data wire pairs and to a separate device, such as a Network Interface Controller 36, via the spare wire pairs. The Y-cable 38 by itself is also shown in FIG. 5.

One drawback of the system of FIG. 5 is that an LTPoE++ (single PSE/PD, four pair) PSE controller IC 32 may detect a PD controller IC 30 on one pair-set, while the other pair-set is unconnected, and then power all four pairs (both pair-sets.) If the Network Interface Controller 36 was later attached at the second endpoint, it may be damaged if not compatible with the voltage on the spare wire pair.

The present invention enables a PSE to determine what type of Ethernet endpoints are attached and then power them appropriately.

Figure 6:
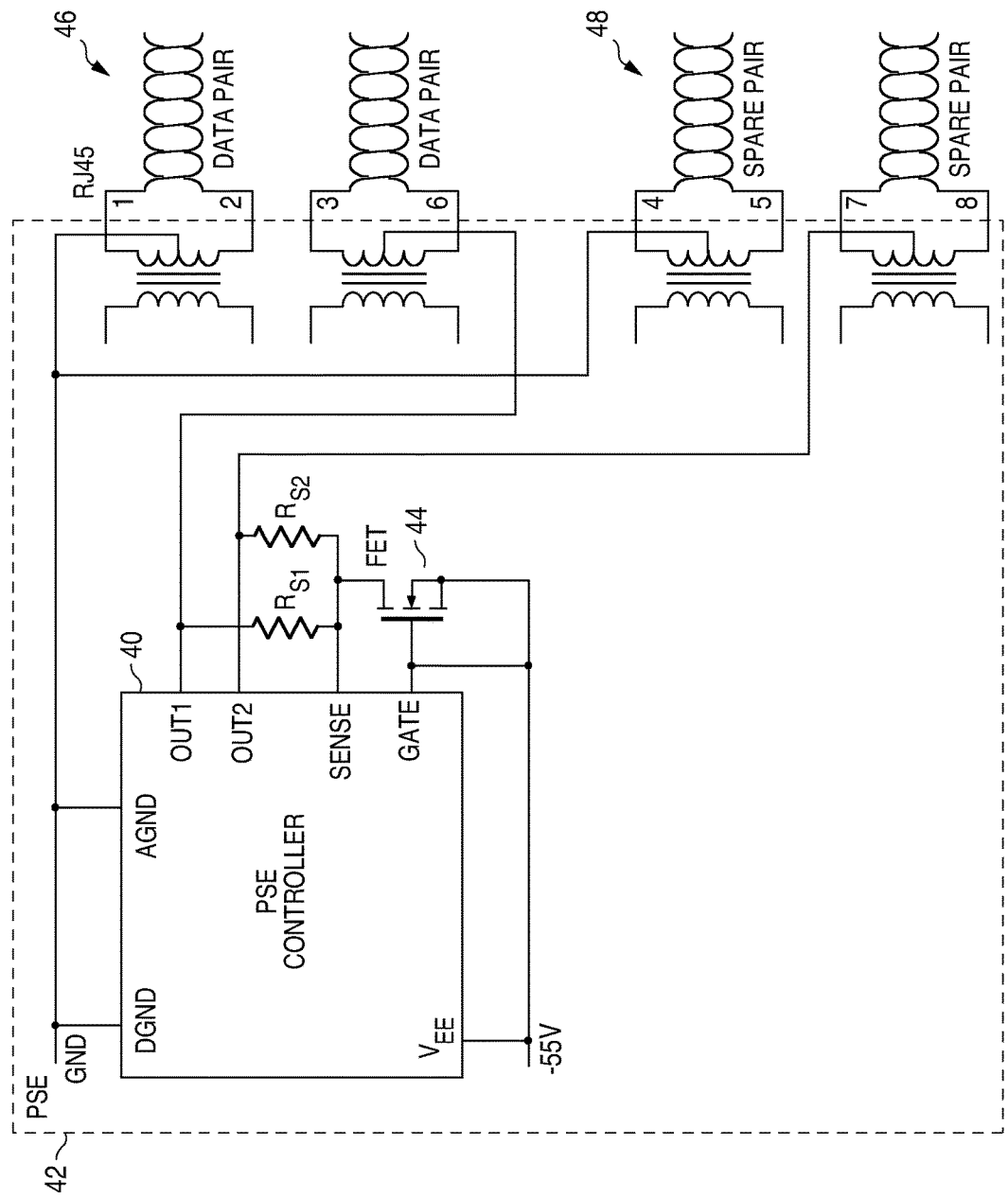
FIG. 6 illustrates a PoE system in accordance with one embodiment of the invention, where handshaking tests are performed to determine whether one or more PoE-compatible devices are connected to the data wire pairs and the spare wire pairs.

FIG. 6 illustrates a PSE configuration, in accordance with one embodiment of the invention, where the PSE controller IC 40, in the PSE 42, has a single power channel, via the FET 44, and uses dual sense resistors $R_{S1}$ and $R_{S2}$ to detect the one or more PDs, if any, coupled to the data wire pairs 46 and the spare wire pairs 48. A PSE voltage source supplies −55 VDC, although other voltages may be used.

First, the PSE controller 40 performs a detection routine to sense a characteristic impedance (e.g., 25 kOhms) in the PD (not shown) that signifies that it is PoE-compatible. The detection is performed by injecting two different currents, $I_{DET1}$ and $I_{DET2}$, on the wire pairs and measuring the delta voltage, described in detail below. This two-point detection allows the PD signature resistance to be isolated from any static diode voltage drops. The routines may be carried out by any type of programmed system in the PSE controller IC 40. A programmed processor, firmware, a state machine, or other logic may be used to carry out the routines described below. Existing PSE controller IC hardware may be easily modified to carry out the inventive routines and provide the various signals on the output pins shown in FIG. 6.

Three types of detections are possible by sourcing the detection currents from the OUT1, OUT2, and SENSE pins, respectively, on the PSE controller IC 40. Results may be combined to determine the type of attached PD or PDs.

Assume $R_{S1}=R_{S2}$, and $R_{S1} \ll R_{SIG}$, where $R_{SIG}$ is the signature resistance of a PoE-compatible PD. In one embodiment, the resistors $R_{S1}$ and $R_{S2}$ are less than 1 Ohm, such as 0.1-0.25 Ohms, so there is only a small voltage drop across the resistors.

OUT1 Detection

During the detection phase, a small forced current $I_{DET1}$ will be driven out the OUT1 pin over the data wire pairs, and a voltage will be generated based on the PD load and the wire resistance. $V1_1$ (VOUT1−$V_{EE}$) will then be measured at the OUT1 pin after a reasonable settling time.

Then, a second, slightly smaller current $I_{DET2}$ will be driven out the OUT1 pin. $V1_2$ (VOUT1−$V_{EE}$) will then be measured after a reasonable settling time. The PD resistance $R_{PD}$ is then detected as follows to determine whether the signature resistance is present.

$$R_{PD}=\Delta V/\Delta I=(V1_1-V1_2)/(I_{DET1}-I_{DET2})$$

If a valid ~25 kOhm PD resistance is detected by the PSE controller IC 40, then it is concluded that a single PD is present at the end of the cable. The PD may be attached on Alt A (see table of FIG. 1), Alt B, or both, via the set of diode bridges shown in FIG. 2.

Y-cable topologies in which the Alt A branch of the Y-cable is connected to a valid PD and the Alt B branch is open may be detected by monitoring the detection voltage V12 across $R_{S1}$ and $R_{S2}$, where V12=OUT1−OUT2. If VOUT1=VOUT2, both the Alt A and Alt B branches are connected to the PD. If VOUT1≠VOUT2, one branch is floating or connected to an invalid detection signature. The PSE 42 may choose not to provide power to a Y-cable topology.

OUT2 Detection

Also during the detection phase, a small forced current $I_{DET1}$ will be driven out the OUT2 pin over the spare wire pairs. $V2_1$ (VOUT2−$V_{EE}$) will be measured at the OUT2 pin after a reasonable settling time. Then, a second, slightly smaller current $I_{DET2}$ will be driven out the OUT2 pin. $V2_2$ (VOUT2−$V_{EE}$) will be measured after a reasonable settling time. The PD resistance is then calculated.

$$R_{PD}=\Delta V/\Delta I=(V2_1-V2_2)/(I_{DET1}-I_{DET2})$$

If a valid ~25 kOhm PD resistance is calculated, then a single PD is present at the end of the cable. The PD may be attached on Alt A, Alt B or both, via the set of diode bridges shown in FIG. 2.

Y-cable topologies in which the Alt B branch of the Y-cable is connected to a valid PD and the Alt A branch is open may be detected by monitoring the voltage V21 across $R_{S1}$ and $R_{S2}$, where V21=OUT2−OUT1. A PSE may choose not to provide power to a Y-cable topology.

SENSE Detection

Also during the detection phase, a small forced current $I_{DET1}$ will be driven out the SENSE pin to both sets of wire pairs. $VS_1$ (VSENSE−$V_{EE}$), $V1S_1$ (VOUT1−VSENSE) and $V2S_1$ (VOUT2−VSENSE) will then be measured after a reasonable settling time.

Then, a second, slightly smaller current $I_{DET2}$ will be driven out the SENSE pin. $VS_2$ (VSENSE−$V_{EE}$), $V1S_2$ (VOUT1−VSENSE) and $V2S_2$ (VOUT2−VSENSE) will then be measured after a reasonable settling time. The PD resistance is then calculated.

$$R_{PD}=\Delta V/\Delta I=(VS_1-VS_2)/(I_{DET1}-I_{DET2})$$

If a valid ~25 kOhm PD resistance is calculated, then a single PD is present at the end of the cable. The PD may be attached on Alt A, Alt B or both, via the set of diode bridges shown in FIG. 2.

Y-cable topologies in which one branch of the Y-cable is connected to a valid PD and the other branch is open may be detected by monitoring the voltage difference between $V1S_N$ and $V2S_N$. A PSE may choose not to provide power to a Y-cable topology.

Figure 7:
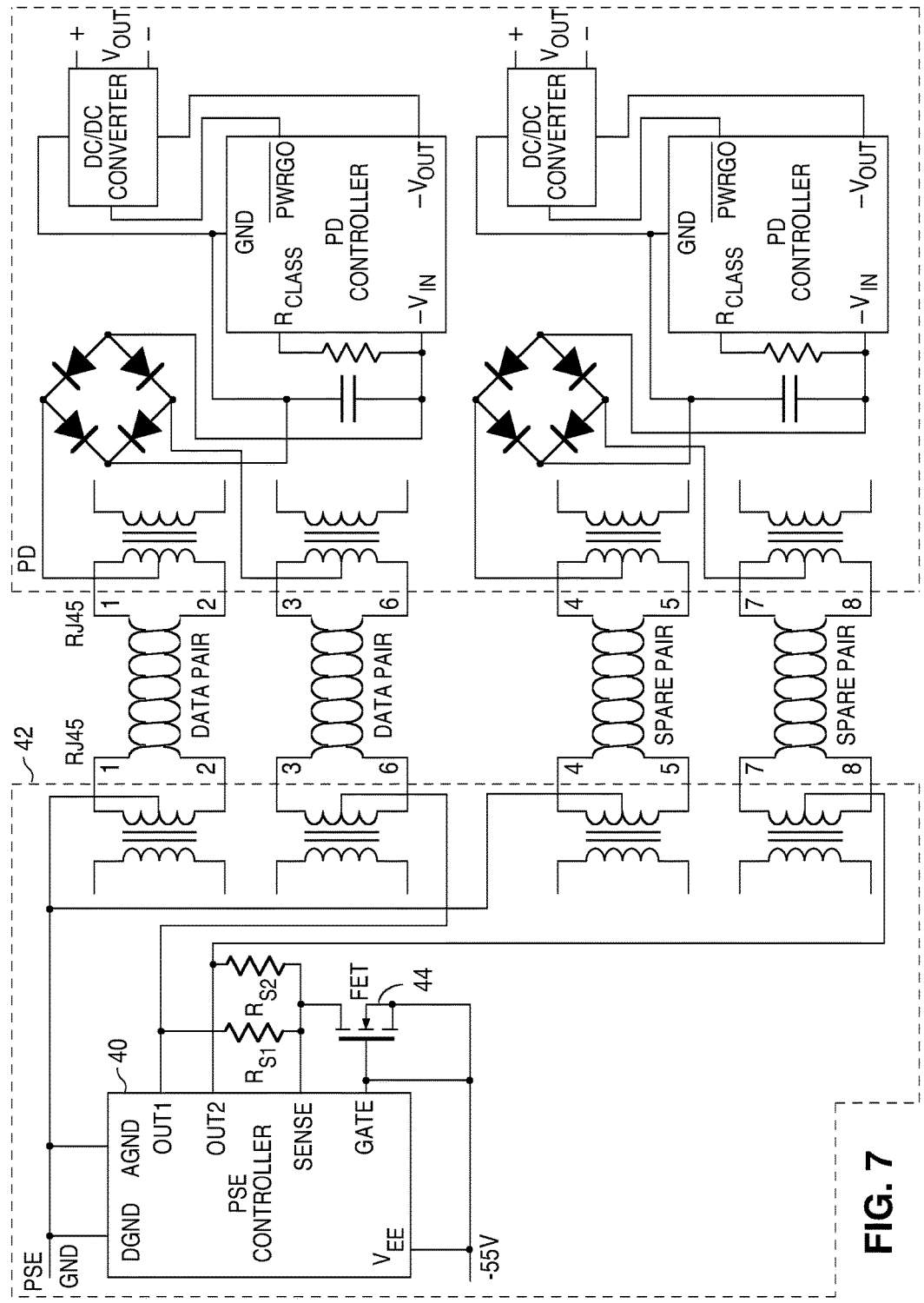
FIG. 7 illustrates a PoE system in accordance with another embodiment of the invention, where separate PD controllers/converters are connected to the data wire pairs and spare wire pairs, and handshaking tests are performed to determine whether one or more PoE-compatible devices are connected to the data wire pairs and the spare wire pairs.

If a ~12.5 kOhm PD resistance is detected (e.g., two 25 kOhm resistors in parallel), then dual PDs are likely present at the end of the cable as shown in FIG. 7. In order to determine whether both individual PD signature resistors are ~25 kOhm, the voltage differences across $V1S_N$ and $V2S_N$ can be examined. Generally, the individual values of resistors which are in parallel can be determined by examining the voltage across the parallel resistors. In this case, the voltage is (VSENSE-$V_{EE}$) and the current through each individual resistor is ($V1S/R_{S1}$) and ($V2S/R_{S2}$).

Classification

Once it is determined during the detection phase that there is at least one PoE-compatable PD coupled to either the data pair or the spare pair, a classification routine may be performed to identify the type or power the PD requires, such as Type I or Type II, specified by the IEEE standards. A classification voltage can be introduced by the PSE via the SENSE pin. Classification current for the Alt A and Alt B pair-sets can be independently measured by determining the voltages across $R_{S1}$ ($V1S_{CLS}$) and $R_{S2}$ ($V2S_{CLS}$).

When $V1S_{CLS}$ and $V2S_{CLS}$ do not match, a Y-cable or invalid PD is present. The PSE can determine whether it will power on such an invalid PD or cable topology.

Once the handshaking routines are complete, and the PSE 42 determines to supply the full PoE voltage to the data pairs and spare pairs, the PSE controller IC 40 closes the FET 44 to supply operating power to the data pairs and spare pairs via the resistors $R_{S1}$ and $R_{S2}$.

As seen, a single PSE controller performs tests to determine the types of PDs connected to the data pairs and spare pairs and supplies the appropriate power to the data pairs and the spare pairs depending on the results of the detection and classification tests.

Although the controllers are described as IC's, they may be formed of discrete components.

While particular embodiments of the present invention have been shown and described, it will be obvious to those skilled in the art that changes and modifications may be made without departing from this invention in its broader aspects and, therefore, the appended claims are to encompass within their scope all such changes and modifications.

What is claimed is:

1. A method performed by a Power over Ethernet (PoE) system comprising data wire pairs and spare wire pairs, the system comprising a Power Sourcing Equipment (PSE) controller having an OUT1 terminal connected to a data wire pair, an OUT2 terminal connected to a spare wire pair, and a SENSE terminal connected to the OUT1 terminal via a first resistor and connected to the OUT2 terminal via a second resistor, the system further comprising a switch controlled by the PSE controller coupled between a PoE voltage source and the SENSE terminal, the method comprising:

supplying a first current to the OUT1 terminal and measuring a $V1_1$ voltage at the OUT1 terminal by the PSE controller;

supplying a second current to the OUT1 terminal and measuring a $V1_2$ voltage at the OUT1 terminal by the PSE controller;

by using $V1_1$ and $V1_2$, detecting whether there is a signature resistance of a PoE-compatible Powered Device (PD) connected to the data wire pair;

supplying the first current to the OUT2 terminal and measuring a $V2_1$ voltage at the OUT2 terminal by the PSE controller;

supplying the second current to the OUT2 terminal and measuring a $V2_2$ voltage at the OUT2 terminal by the PSE controller;

by using $V2_1$ and $V2_2$, detecting whether there is a signature resistance of a PoE-compatible PD connected to the spare wire pair;

supplying the first current to the SENSE terminal and measuring a VSENSE1 voltage at the SENSE terminal by the PSE controller;

supplying the second current to the SENSE terminal and measuring a VSENSE2 voltage at the SENSE terminal by the PSE controller;

by using VSENSE1 and VSENSE2, detecting whether there is zero, one, or two PoE-compatible PDs connected to the data wire pair and the spare wire pair; and based on the detection of voltages at the OUT1, OUT2, and SENSE terminals, determining, by the PSE controller, whether to control the switch to couple the PoE voltage source to the data wire pair and spare wire pair.

2. The method of claim 1 wherein:

the step of using $V1_1$ and $V1_2$ to detect whether there is a signature resistance of a PoE-compatible PD connected to the data wire pair comprises detecting a resistance of the PD as $\Delta V/\Delta I=(V1_1-V1_2)/(I_{DET1}-I_{DET2})$, where $I_{DET1}$ is the first current and $I_{DET2}$ is the second current; wherein the step of using $V2_1$ and $V2_2$ to detect whether there is a signature resistance of a PoE-compatible PD connected to the spare wire pair comprises detecting a resistance of the PD as $\Delta V/\Delta I=(V2_1-V2_2)/(I_{DET1}-I_{DET2})$, where $I_{DET1}$ is the first current and $I_{DET2}$ is the second current; and wherein the step of using VSENSE1 and VSENSE2 to detect whether there is zero, one, or two PoE-compatible PDs connected to the data wire pair and the spare wire pair comprises detecting a resistance of the PD as $\Delta V/\Delta I=$ (VSENSE1−VSENSE2)/($I_{DET1}-I_{DET2}$), where $I_{DET1}$ is the first current and $I_{DET2}$ is the second current.

3. A Power over Ethernet (PoE) system comprising:

a Power Sourcing Equipment (PSE) controller having an OUT1 terminal connected to a data wire pair, an OUT2 terminal connected to a spare wire pair, and a SENSE terminal connected to the OUT1 terminal via a first resistor and connected to the OUT2 terminal via a second resistor;

a switch controlled by the PSE controller coupled between a PoE voltage source and the SENSE terminal;

the PSE controller being configured to supply currents to the OUT1 terminal, the OUT2 terminal, and the SENSE terminal, during a handshaking phase, to detect signature resistances of zero, one, or two Powered Devices (PDs) connected to the data wire pair and the spare wire pair; and the PSE controller being configured to close the switch after it has been determined that at least one PoE-compatible PD is connected to the data wire pair and/or spare wire pair.

4. The system of claim 3 wherein the PSE controller is configured for:

supplying a first current to the OUT1 terminal and measuring a $V1_1$ voltage at the OUT1 terminal by the PSE controller;

supplying a second current to the OUT1 terminal and measuring a $V1_2$ voltage at the OUT1 terminal by the PSE controller;

by using $V1_1$ and $V1_2$, detecting whether there is a signature resistance of a PoE-compatible Powered Device (PD) connected to the data wire pair;

supplying the first current to the OUT2 terminal and measuring a $V2_1$ voltage at the OUT2 terminal by the PSE controller;

supplying the second current to the OUT2 terminal and measuring a $V2_2$ voltage at the OUT2 terminal by the PSE controller;

by using $V2_1$ and $V2_2$, detecting whether there is a signature resistance of a PoE-compatible PD connected to the spare wire pair;

supplying the first current to the SENSE terminal and measuring a VSENSE1 voltage at the SENSE terminal by the PSE controller;

supplying the second current to the SENSE terminal and measuring a VSENSE2 voltage at the SENSE terminal by the PSE controller;

by using VSENSE1 and VSENSE2, detecting whether there is zero, one, or two PoE-compatible PDs connected to the data wire pair and the spare wire pair; and based on the detection of voltages at the OUT1, OUT2, and SENSE terminals, determining, by the PSE controller, whether to control the switch to couple the PoE voltage source to the data wire pair and spare wire pair.

5. The system of claim 3 wherein resistances of the first resistor and second resistor are less than 1 Ohm.

6. The system of claim 3 wherein one PD is connected to the data wire pair.

7. The system of claim 3 wherein one PD is connected to the spare wire pair.

8. The system of claim 3 wherein one PD is connected to both the data wire pair and the spare wire pair.

9. The system of claim 3 wherein one PD is connected to the data wire pair and another PD is connected to the spare wire pair.

10. The system of claim 3 wherein the signature resistance of the at least one PoE-compatible PD is approximately 25 kOhms.

* * * * *